(12) United States Patent
Tanaka

(10) Patent No.: US 7,133,656 B2
(45) Date of Patent: Nov. 7, 2006

(54) DIRECT CONVERSION RECEIVER

(75) Inventor: Sachiko Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 309 days.

(21) Appl. No.: 10/921,523

(22) Filed: Aug. 19, 2004

(65) Prior Publication Data

US 2005/0020230 A1    Jan. 27, 2005

Related U.S. Application Data

(63) Continuation of application No. PCT/JP02/04042, filed on Apr. 23, 2002.

(51) Int. Cl.
*H04B 1/10* (2006.01)

(52) U.S. Cl. .......... 455/310; 455/317; 455/324

(58) Field of Classification Search ............ 455/232.1, 455/234.1, 285, 296, 302–304, 310, 317, 455/324
See application file for complete search history.

(56) References Cited

U.S. PATENT DOCUMENTS

| | | |
|---|---|---|
| 4,944,025 A | 7/1990 | Gehring et al. |
| 5,119,399 A * | 6/1992 | Santos et al. ............ 375/224 |
| 5,918,167 A * | 6/1999 | Tiller et al. .................. 455/310 |

FOREIGN PATENT DOCUMENTS

| | | |
|---|---|---|
| JP | 2001-119316 | 4/2001 |
| JP | 2002-076976 | 3/2002 |

OTHER PUBLICATIONS

Supplementary European Search Report dated May 25, 2005.
International Search Report dated Jul. 9, 2002.

* cited by examiner

*Primary Examiner*—Nguyen T. Vo
(74) *Attorney, Agent, or Firm*—Katten Muchin Rosenman LLP

(57) ABSTRACT

A direct conversion receiver is disclosed wherein a received RF signal is mixed in a mixer with a local oscillation signal having a frequency the same as a desired central frequency, and is down-converted to a base band signal. The receiver comprises a divider for dividing the received RF signal; an adder provided at a received RF signal input side of the mixer; a phase shifter provided before the input of the mixer, for shifting a phase of the divided signal of the received RF signal; and a gain adjustable amplifier provided after the divider, and before or after the phase shifter, for amplifying the divided signal to supply the phase-shifted and amplified signal to the adder. Accordingly a DC offset due to the direct conversion can be removed and an adverse effect due to transient response when the DC offset changes can be prevented.

7 Claims, 6 Drawing Sheets

DIRECT CONVERSION RECEIVER

CROSS-REFERENCE TO RELATED APPLICATION

This application is a U.S. continuation application filed under 35 USC 111(a) claiming benefit under 35 USC 120 and 365(c) of PCT application JP02/04042, filed Apr. 23, 2002, which is hereby incorporated herein by reference.

BACKGROUND OF THE INVENTION

1. Field of the Invention

The present invention generally relates to a direct conversion receiver, and especially relates to such a direct conversion receiver that is used in a cellular telephone terminal.

2. Description of the Related Art

Direct conversion type receivers have been developed in place of prior super-heterodyne type receivers for use in cellular telephone terminals.

The direct conversion system has no substantial image disturbance problem, because it directly converts RF (high frequency signal) to a base band without using an intermediate frequency stage. Because of having no IF (intermediate frequency) filter, the direct conversion system is highly promising for miniaturizing cellular telephones and reducing costs.

However, there are some problems to be solved for realizing direct conversion receivers. One of them is a DC offset problem that occurs when a received frequency is the same as the local oscillation frequency.

Ideally, since the isolation (impedance) between an LO (local oscillation signal) port and an RF port of a mixer is complete (infinite), the LO signal does not leak to the RF port in the mixer. In actual mixers, however, since the isolation is not complete, a portion of the energy of the LO signal leaks to the RF port side, and is reflected by an amplifier upstream from the mixer, returned to the mixer again, and mixed with the local oscillation signal at the mixer.

Since the RF frequency and LO frequency are the same in the direct conversion system, this component becomes DC that is called a "DC offset". This becomes a disturbance component against a desired base band signal and may result in receiving sensitivity degradation.

The leakage is explained by using an equation. A signal input to the mixer can be represented by the following equation. The first term represents a desired frequency (only frequency $\omega_{RF}$ component is indicated), and the second term represents local oscillation leakage (LO leakage) from the LO port to the RF port of the mixer. The coefficient A of the second term means an LO leakage coefficient.

$$\sin \omega_{RF} t + A \cdot \sin \omega_{LO} t \qquad (a)$$

This can be mixed with the local oscillation signal $\sin \omega_{LO} t$, resulting in:

$$(\sin\omega_{RF} t + A \cdot \sin\omega_{LO} t) \times \sin\omega_{LO} t = -1/2[\cos(\omega_{RF} + \omega_{LO})t] + \qquad (b)$$
$$1/2[\cos(\omega_{RF} - \omega_{LO})t] -$$
$$A/2[\cos(2\omega_{LO} t)] +$$
$$A/2[\cos(\omega_{RF} - \omega_{LO})t]$$

The first and third terms in the right part of the equation (b) can be removed by a LPF downstream from the mixer. The second term in the right part of the equation (b) is a desired base band signal. The fourth term in the right part of the equation (b) appears at the output of the mixer as a DC offset due to the LO leakage.

In the prior art, in order to remove DC and its neighboring frequency components and eliminate DC offset influence, a high pass filter or a capacitor for AC coupling is connected at the output of the mixer.

FIG. 1 shows a block diagram of an example of conventional cellular telephone terminals. The cellular telephone terminal shown in FIG. 1 has a transmitter 18 and receiver 20. After an antenna 10 is provided a duplexer 12, which separates transmission waves and reception waves.

As for the transmission waves, a voice signal input from a microphone 14 is encoded in a signal processor 16, modulated in the transmitter 18, and transmitted via the duplexer 12 and the antenna 10. As for the reception waves, a signal received at the antenna 10 is supplied via the duplexer 12 to the receiver 20, demodulated there, converted to a voice signal in the signal processor 16, and output at a speaker.

FIG. 2 shows a block diagram of an example of conventional direct conversion receivers. A portion surrounded by a dotted line in FIG. 2 corresponds to the receiver 20 shown in FIG. 1. Since the present invention is not related to the transmitter and the signal processor, these are not explained herein below.

In FIG. 2, a QPSK (Quadrature Phase-Shift-Keying) modulated RF signal received at an antenna 10 passes through an RF filter 102, and is amplified in an RF amplifier 103, then separated into two branch routes. The branched RF signals are mixed with a local oscillation signal (carrier) in a mixer 106a and a mixer 106b, respectively. The local oscillation signal is supplied from a local oscillator 104 and has the same frequency as that of the received RF signal. The local oscillator 104 supplies the local oscillation signal via a 90 degree phase shifter 105 to a first mixer 106a and supplies it directly to a second mixer 106b.

From the mixers 106a and 106b are obtained base band signals (I-signal and Q-signal), which pass through low pass filters 107a and 107b respectively, so as to perform channel selection. Base band signals (I-signal and Q-signal) output from the low pass filters 107a and 107b are fed to capacitors 110a and 110b, respectively, where components in the near neighborhood of DC are removed. Signals output from the capacitors 110a and 110b are amplified by base band amplifiers 108a and 108b, respectively, and then supplied to a controller 130. High pass filters having a very low cutoff frequency can be used in place of the capacitors 110a and 110b.

However, these conventional offset canceling methods utilizing AC coupling by capacitors or high pass filters have a problem that in a case of received signals having a DC signal component, a part of desired signals are removed resulting in degradation of receiving characteristics.

FIG. 3 is a graph of a frequency spectrum, which shows a DC offset 25 due to LO leakage, a desired base band signal 26, and frequency characteristics 27 depending on whether AC coupling or high pass filters are used.

In a case where the DC offset varies with time, a transient response is generated corresponding to time constants of the AC coupling or high pass filters. Until the transient response fades out, desired signal waves are influenced by the offset, resulting in degradation of receiving characteristics. FIG. 4(A) shows signal waves when the DC offset varies at time=t0. FIG. 4(B) shows signal waves when the DC offset is removed by AC coupling. FIG. 4 also shows a desired wave 28, a DC component 29 necessary to the system and a DC offset component 30 disturbing the system.

In order to minimize removing the desired base band signal 26 shown in FIG. 3, it is necessary to make the capacitors 110a and 110b large. However, as the capacitors 110a and 110b become larger, the time constant becomes longer.

When it is tried to cancel the DC offset by using AC coupling or high pass filters as shown in FIG. 2, if the DC offset varies with time as shown in FIG. 4(A), then the signal becomes like the dotted line 32 due to the influence of the time constants of the AC coupling or high pass filters. Therefore, there is a problem in that during the period from t0 to t1, the DC offset remains without cancellation, resulting in degradation of receiving characteristics. As the time constant becomes larger, the period from t0 to t1 becomes longer.

SUMMARY OF THE INVENTION

It is a general object of the present invention to provide a direct conversion receiver that can remove a DC offset and has no adverse effect due to transient response when the DC offset varies with time.

A more specific object of the present invention is to provide a direct conversion receiver in which a received RF signal is mixed in a mixer with a local oscillation signal having a frequency the same as a desired central frequency, and is down-converted to a base band signal, comprising: a divider for dividing the received RF signal; an adder provided at a received RF signal input side of the mixer; a phase shifter provided before the input of the mixer, for shifting a phase of the divided signal of the received RF signal; and a gain adjustable amplifier provided after the divider, and before or after the phase shifter, for amplifying the divided signal to supply the phase-shifted and amplified signal to the adder.

Such a direct conversion receiver according to the present invention can remove a DC offset and prevent bad influence due to transient response when the DC offset varies with time.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by the direct conversion receiver particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides as follows.

DESCRIPTION OF THE PREFERRED EMBODIMENTS

In the following, embodiments of the present invention are described with reference to the accompanying drawings.

Figure 1:
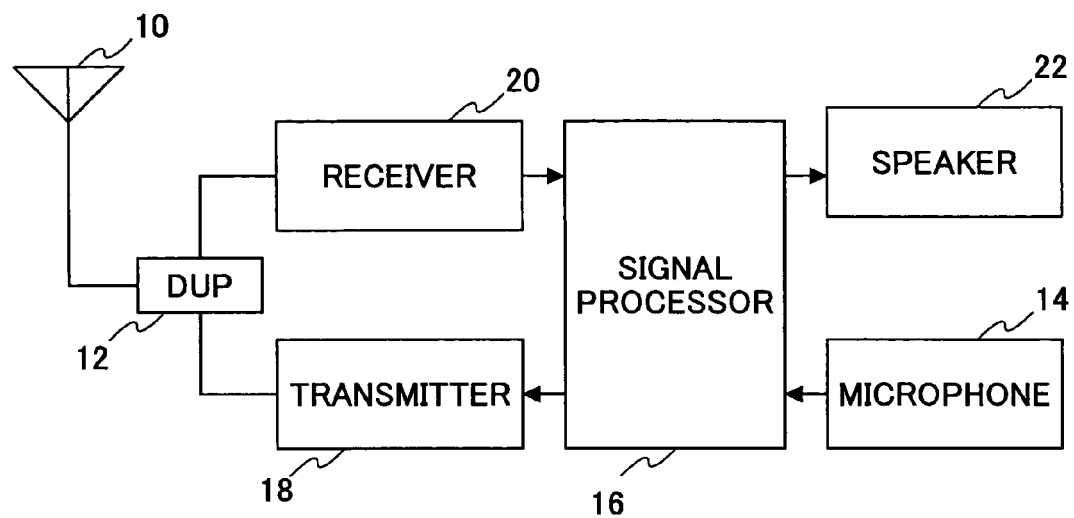
FIG. 1 is a block diagram of an example of cellular telephone terminals.
Figure 2:
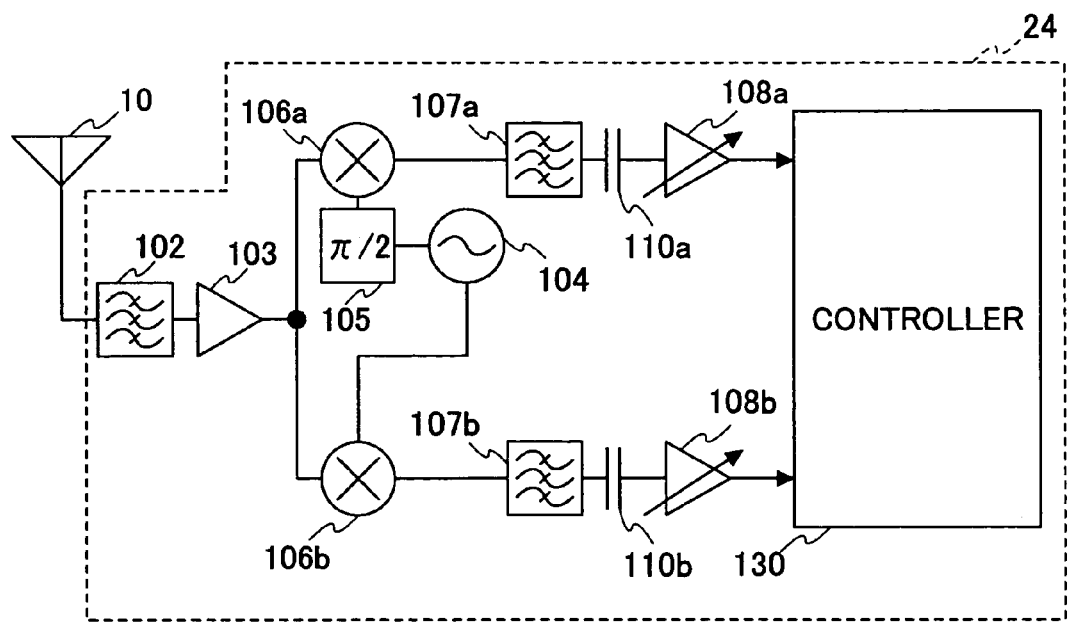
FIG. 2 is a block diagram of an example of conventional direct conversion receivers.
Figure 3:
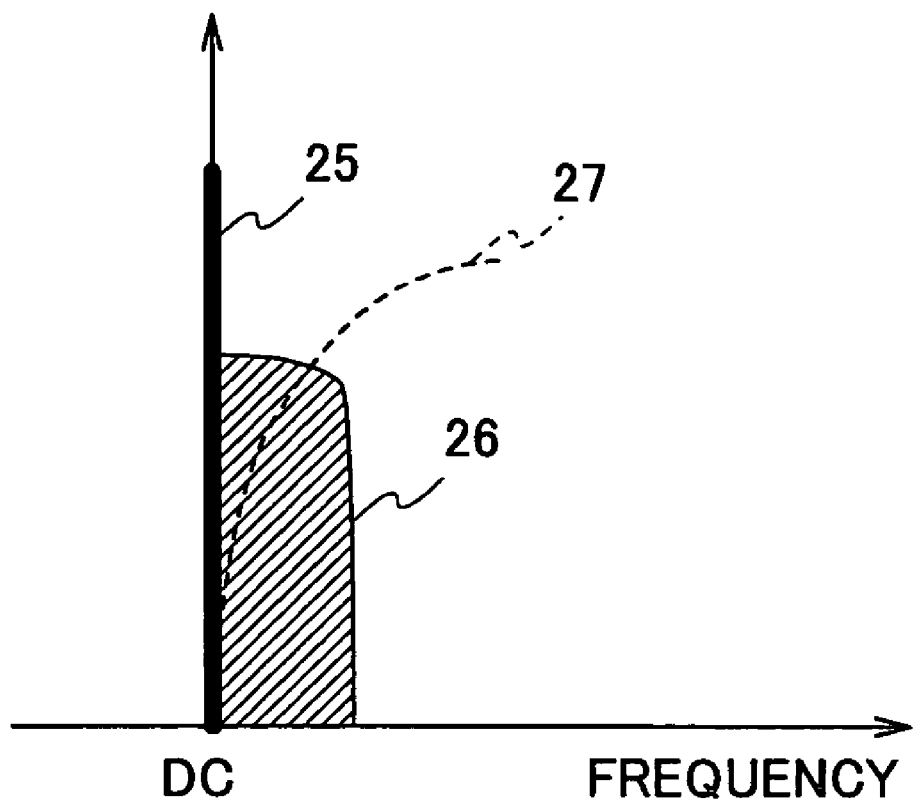
FIG. 3 is a frequency spectrum graph showing a DC offset, a desired base band signal, and frequency characteristics depending on AC coupling or high pass filters.
Figure 4:
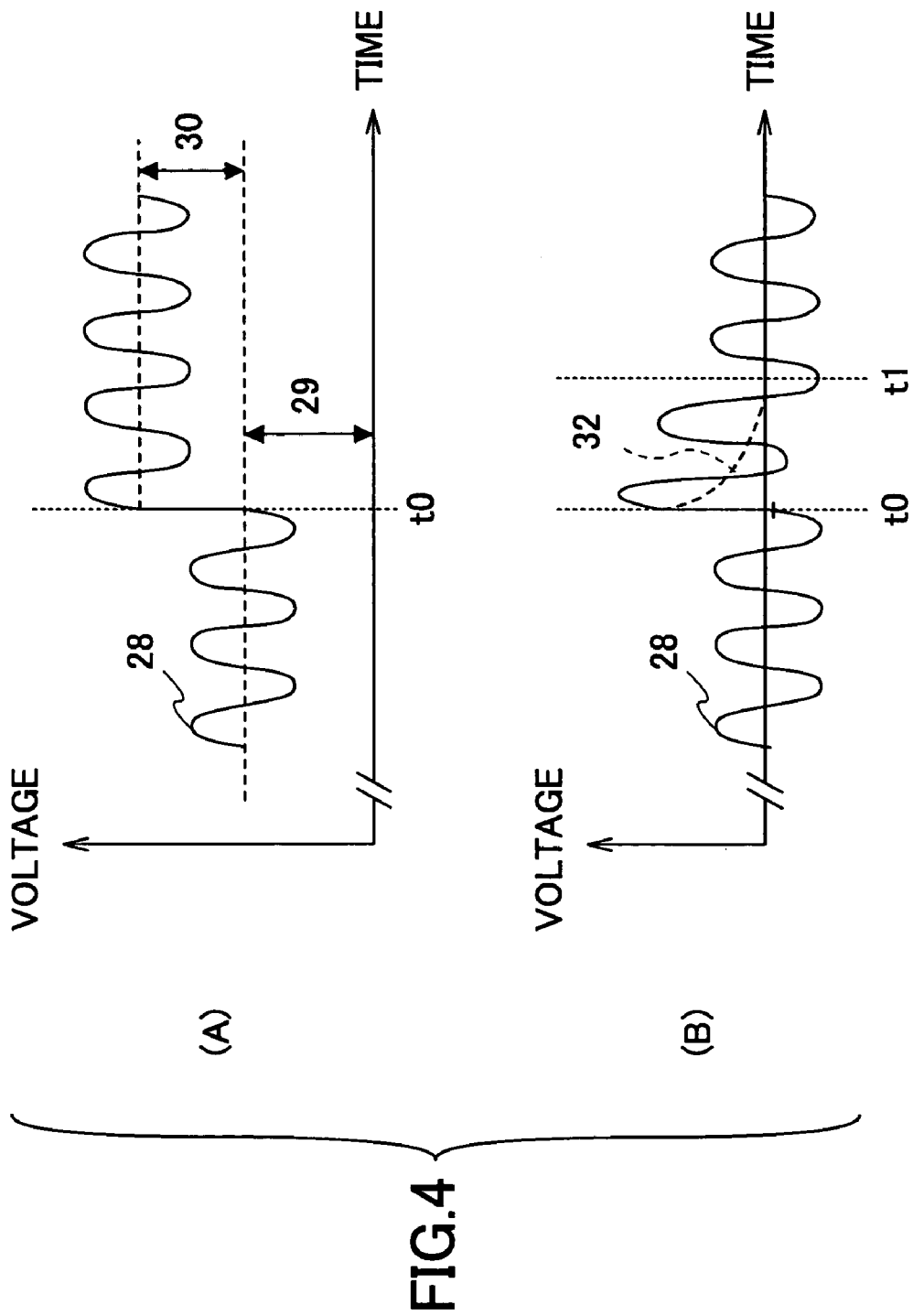
FIG. 4 shows signal waves having DC offset due to LO leakage and removing the DC offset by AC coupling.
Figure 5:
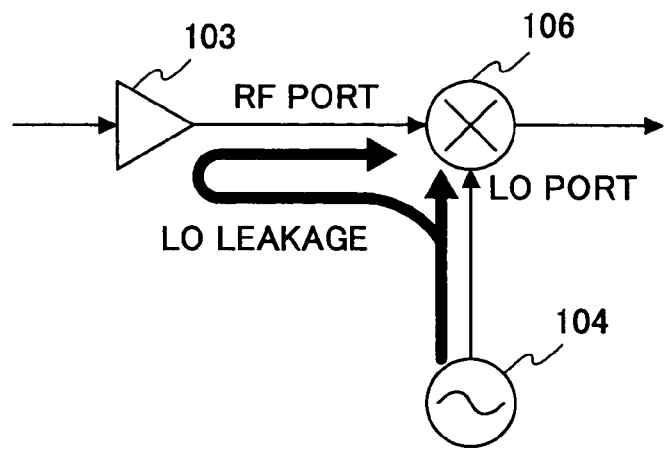
FIG. 5 shows a mixer and its peripheral devices provided in a prior receiver.

FIG. 5 is a schematic diagram showing a mixer and its peripheral devices in a prior art receiver. The mixer 106 corresponds to both the mixers 106a and 106b shown in FIG. 2, and the same explanation is applicable to both the mixers 106a and 106b.

Herein, an input RF signal is represented by $\sin \omega_{RF} t$, and a local oscillation signal is represented by $\sin \omega_{LO} t$. A leakage component (LO leakage component) that leaks from an LO port to an RF port of the mixer 106, is reflected by an RF amplifier 103 and so on, and input to the mixer 106 again.

Figure 6:
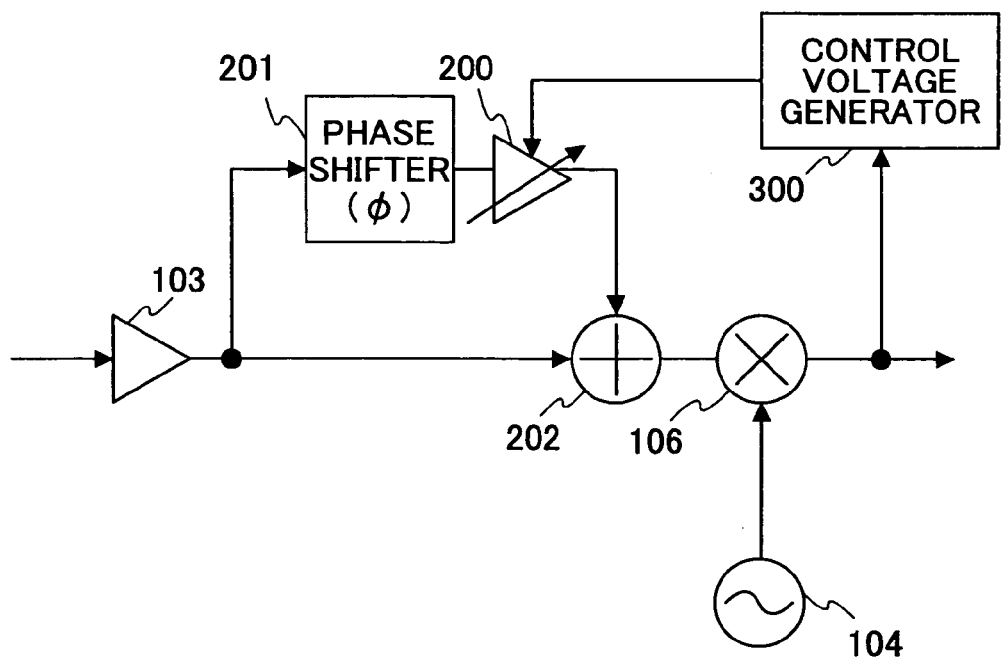
FIG. 6 is a block diagram of a mixer and its peripheral devices of a direct conversion receiver according to a first embodiment of the present invention.

FIG. 6 shows a block diagram of a first embodiment of a mixer and its peripheral devices that are main parts of the direct conversion receiver of the present invention. The mixer 106 corresponds to both the mixers 106a and 106b shown in FIG. 2, and the same explanation is applicable to both the mixers 106a and 106b. Phases of an RF signal and a local oscillation signal are synchronized by an AFC (Automatic Frequency Control).

In FIG. 6, an RF output signal from an RF amplifier 103 is divided into two portions, and one portion is supplied to a phase shifter 201 and the other portion is supplied to an adder 202. The RF signal shifted by the phase shifter 201 is amplified by a gain adjustable amplifier 200, and then supplied to the adder 202 where it is added to the other RF signal.

In FIG. 6, the gain adjustable amplifier 200 is arranged after the phase shifter 201, but the arrangement order can be reversed.

If the amount of phase shifting of the phase shifter 201 is represented by $\phi$, and the gain of the gain adjustable controller 200 is represented by B, then a signal supplied to the RF port of the mixer 106 can be represented by the following formula (1).

$$\sin \omega_{RF} t + A \sin(\omega_{LO} t + \theta) + B\{\sin(\omega_{RF} t + \phi) + A \sin(\omega_{LO} t + \theta + \phi)\} \quad (1)$$

The first term of the formula (1) represents the input RF signal, and the second term represents the LO leakage component. An LO leakage voltage is represented by A, and a phase difference with respect to the RF signal generated by the leakage is represented by $\theta$. The third term represents a desired RF signal component obtained by adding the gain B and phase shift $\phi$ to the divided signal. The fourth term represents the leakage component to which a similar phase shift and gain are added. The signal represented by the formula (1) is multiplied by a local oscillation signal $\alpha \sin \omega_{LO} t$ in the mixer 106, and an output from the mixer 160 can be represented by the following equation (2).

$$[\sin\omega_{RF}t + A\sin(\omega_{LO}t+\theta) + B\{\sin(\omega_{RF}t+\phi) + \quad (2)$$
$$A\sin(\omega_{LO}t+\theta+\phi)\}] \times \alpha\sin\omega_{LO}t =$$
$$-(\alpha/2)\cos(\omega_{LO}+\omega_{RF})t +$$
$$(\alpha/2)\cos(\omega_{LO}-\omega_{RF})t -$$
$$(A\alpha/2)\cos(2\omega_{LO}t+\theta) +$$
$$(A\alpha/2)\cos\theta -$$
$$(B\alpha/2)\cos(\omega_{RF}t+\omega_{LO}t+\phi) +$$
$$(B\alpha/2)\cos(\omega_{RF}t+\phi-\omega_{LO}t) -$$
$$(AB\alpha/2)\cos(\omega_{LO}t+\theta+\phi+\omega_{LO}t) +$$
$$(AB\alpha/2)\cos(\theta+\phi)$$

The second term in the right part of the equation (2) represents a desired base band signal. The first, third, fifth and seventh terms can easily be removed by low pass filters 107a, 107b which are usually inserted after the mixer 106. Therefore, the remaining terms in the equation (2) can be represented by the following expression (3).

$$(A\alpha/2)\cos\theta + (B\alpha/2)\cos\phi + (AB\alpha/2)\cos(\theta+\phi) \quad (3)$$

In the expression (3), amounts of B and φ are adjustable, and A and θ are unknown. By adjusting so that φ=90 degrees in the expression (3), the second term can be deleted and the third term becomes $-(AB\alpha/2)\sin\theta\phi$. Since it is considered that neither A nor α is zero, the following requirement (4) is needed in order to make the expression (3) zero.

$$B = 1/\tan\theta tm \quad (4)$$

Clearly understood from the requirement (4), the undesired signals represented by the expression (3) become independent of A, and therefore only the phase shift amount θ of the LO leakage has to be paid attention to. That is, the phase shift amount of the phase shifter 201 is fixed at 90 degrees, and the gain B of the gain adjustable amplifier 200 can be adjusted while monitoring a DC voltage level of the mixer output.

As seen in FIG. 6, the output signal of the mixer 106 is supplied to a control voltage generator 300. The control voltage generator 300 measures the level of the output signal of the mixer 106, determines a gain control voltage for the gain adjustable amplifier 200 based on the measured level of the output signal of the mixer 106, and supplies the determined control voltage to the gain adjustable amplifier 200. This control voltage is adjusted so that the DC voltage level of the output signal of the mixer 106 (that is the DC voltage level measured by the control voltage generator 300) becomes a predetermined level required in the system.

Accordingly, the control voltage generator 300 supplies a control voltage satisfying the requirement (4) to the gain adjustable amplifier 200. The LO leakage component is canceled by the divided RF signal, and the LO leakage component becomes zero before being input to the mixer 106. The adjustment of the gain B of the gain adjustable amplifier 200 is carried out in accordance with the procedure shown in the FIG. 7 flow chart.

Figure 7:
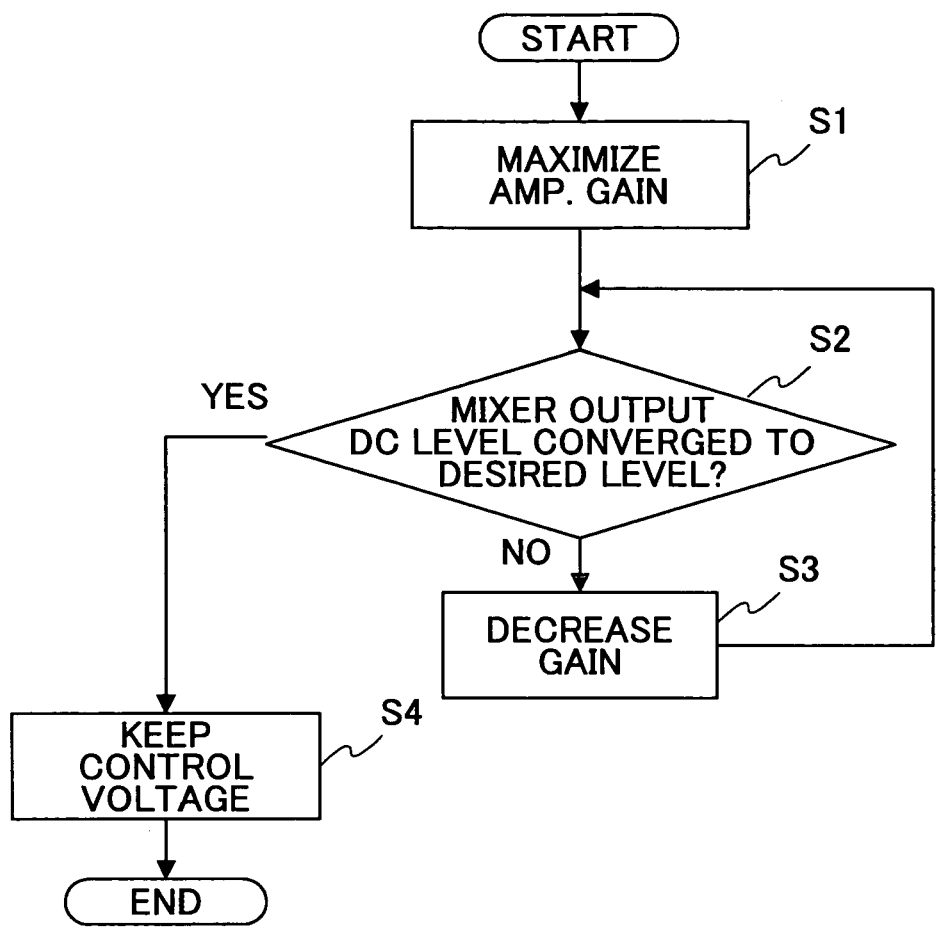
FIG. 7 is a flowchart illustrating a gain adjusting procedure in a gain adjustable amplifier.

In FIG. 7, the gain of the gain adjustable amplifier 200 is maximized at step S1. Next, it is determined at step S2 whether the DC voltage level of the output signal of the mixer 106 has converged to the predetermined voltage level. If the DC voltage level has not yet converged, the gain of the gain adjustable amplifier 200 is decreased by a certain amount at step S3 and the procedure goes to step S2.

As the gain of the gain adjustable amplifier 200 is decreased little by little at step S3, the DC voltage level of the output signal of the mixer 106 finally reaches the predetermined voltage level. Then the procedure goes to step S4 and the then control voltage is maintained and the procedure ends. In this manner, the gain of the gain adjustable amplifier 200 most suitable to the receiver is found.

Figure 8:
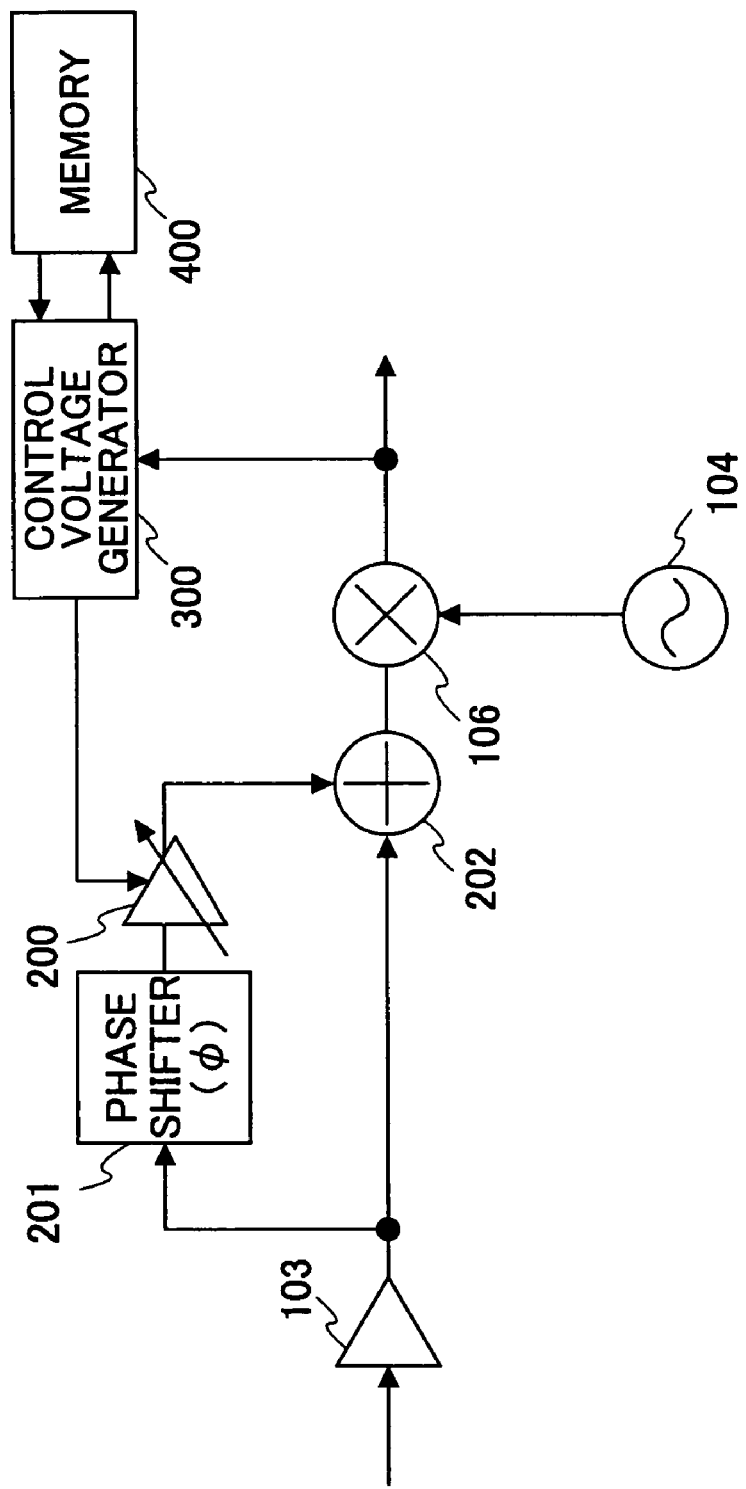
FIG. 8 is a block diagram of a mixer and its peripheral devices of a direct conversion receiver according to a second embodiment of the present invention.

FIG. 8 shows a block diagram of a second embodiment of a mixer and its peripheral devices that is a main part of the present invention direct conversion receiver. Parts in FIG. 8 the same as those in FIG. 6 are assigned the same reference numerals and their explanations are omitted.

In order to shorten the time required for the convergence of the gain of the gain adjustable amplifier 200, a memory 400 stores a certain constant value as an initial value. When the cellular telephone is turned ON and starts receiving signals, the control voltage generator 300 reads out the initial value from the memory 400 to adjust the gain of the gain adjustable amplifier 200.

This certain constant value is, for example, estimated and determined based on a LO leakage amount expected from the circuit structure at the stage of developing the cellular telephones.

The memory 400 may have stored the gain of the gain adjustable amplifier 200 immediately before the cellular telephone's being turned OFF last time, and the control voltage generator 300 may read out the stored gain from the memory 400 as an initial gain.

The LO leakage amount mainly depends on the incompleteness of the isolation between the LO port and the RF port of the mixer 106, and therefore is considered not to vary with time. Accordingly the second embodiment can shorten the time required for completely removing the DC offset at turning ON.

According to the embodiments of the present invention, even if the energy of the local oscillation signal partially leaks to the RF port due to the incompleteness of the isolation between the LO port and RF port of the mixer 106, a signal for canceling the leakage can be generated by measuring the DC voltage level of a desired base band signal and setting an adequate gain based on the measured DC voltage level. Accordingly, a DC offset due to the LO leakage does not appear at the output of the mixer 106.

Further, there is no need to add an AC coupling or high pass filter for the base band signal from the mixer 106, and therefore there is no need to deal with the adverse effect on the system that would occur due to the transient response caused by an AC coupling and high pass filter.

Since the embodiments of the present invention can remove the DC offset due to the LO leakage, there is no need to have an additional LO leakage suppression circuit or to perform digital processing for the DC offset removal, resulting in characteristic improvement and work load decrease of the receiver.

In this manner, since the direct conversion receiver according to the embodiments of the present invention comprises a divider for dividing a received RF signal; an adder 202 provided at a received RF signal input side of the mixer; a phase shifter 201 provided before the input of the mixer 106, for shifting a phase of the divided signal of the received RF signal; and a gain adjustable amplifier 200 provided after the divider, and before or after the phase shifter, for amplifying the divided signal to supply the phase-shifted and amplified signal to the adder, it can remove the DC offset generated by direct conversion, and prevent adverse effects due to transient response when the DC offset changes.

By setting the phase shift amount of the phase shifter 201 at 90 degrees, the DC offset can be removed by a simple circuit structure.

Since the direct conversion receiver may have a control voltage generator 300 for controlling the gain of the gain adjustable amplifier 200 so that a DC voltage level of a base band signal output from the mixer 106 is controlled, the DC offset can be automatically removed.

The control voltage generator 300 can maximize an initial gain value of the gain adjustable amplifier 200, and then can decrease the gain until the DC voltage level of the base band signal output from the mixer reaches a predetermined level. Then the DC offset can be surely removed.

The direct conversion receiver can have a memory 400 for storing an initial value, and the control voltage generator 300 can read out the initial value from the memory 400 and set the gain of the gain adjustable amplifier 200 at the initial value. The gain of the gain adjustable amplifier 200 can be decreased until the DC voltage level of the base band signal output from the mixer reaches a predetermined voltage level, and therefore can shorten the time required for removing the DC offset.

The phase shifter 201 is an example of the phase shifter recited in the claims, the gain adjustable amplifier 200 is an example of the gain adjustable amplifier recited in the claims, the adder 202 is an example of the adder recited in the claims, the control voltage generator 300 is an example of the gain controller, and the memory 400 is an example of the memory recited in the claims.

Further, the present invention is not limited to these embodiments, but various variations and modifications may be made without departing from the scope of the present invention.

What is claimed is:

1. A direct conversion receiver in which a received RF signal is mixed in a mixer with a local oscillation signal having a frequency the same as a desired central frequency, and down-converted to a base band signal, comprising:
    a divider for dividing the received RF signal;
    an adder provided at a received RF signal input side of the mixer;
    a phase shifter provided before the input of the mixer, for shifting a phase of the divided signal of the received RF signal; and
    a gain adjustable amplifier provided after the divider, and before or after the phase shifter, for amplifying the divided signal to supply the phase-shifted and amplified signal to the adder.

2. The direct conversion receiver as claimed in claim 1, wherein a phase shifting amount of the phase shifter is 90 degrees.

3. The direct conversion receiver as claimed in claim 1, further comprising:
    a gain controller for controlling a gain of the gain adjustable amplifier so that a DC voltage level of the base band signal output from the mixer becomes a predetermined level.

4. The direct conversion receiver as claimed in claim 3 wherein,
    the gain controller maximizes an initial gain value of the gain adjustable amplifier, and then decreases the gain of the gain adjustable amplifier until the DC voltage level of the base band signal becomes the predetermined level.

5. The direct conversion receiver as claimed in claim 3, further comprising:
    a memory for storing an initial value;
    wherein, the gain controller sets the gain of the gain adjustable amplifier at the initial value read out from the memory, and decreases the gain of the gain adjustable amplifier until the DC voltage level of the base band signal becomes the predetermined level.

6. The direct conversion receiver as claimed in claim 5 wherein,
    the memory stores a constant value expected based on circuit structure as the initial value.

7. The direct conversion receiver as claimed in claim 5 wherein,
    the memory stores a gain of the gain adjustable amplifier expected based on the circuit structure immediately before turning OFF last time, as an initial value.

* * * * *